United States Patent
Chen et al.

(10) Patent No.: US 10,217,855 B2
(45) Date of Patent: Feb. 26, 2019

(54) SEMICONDUCTOR SUBSTRATE AND SEMICONDUCTOR DEVICE

(71) Applicant: Nuvoton Technology Corporation, Hsinchu (TW)

(72) Inventors: Chih-Wei Chen, Hsinchu (TW); Heng-Kuang Lin, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/811,699

(22) Filed: Nov. 14, 2017

(65) Prior Publication Data

US 2018/0175186 A1  Jun. 21, 2018

(30) Foreign Application Priority Data

Dec. 20, 2016  (TW) ............... 105142128 A

(51) Int. Cl.
| | |
|---|---|
| H01L 29/06 | (2006.01) |
| H01L 29/778 | (2006.01) |
| H01L 29/40 | (2006.01) |
| H01L 21/266 | (2006.01) |
| H01L 29/66 | (2006.01) |
| H01L 21/265 | (2006.01) |
| H01L 29/417 | (2006.01) |
| H01L 29/423 | (2006.01) |
| H01L 29/20 | (2006.01) |

(52) U.S. Cl.
CPC ........ *H01L 29/7787* (2013.01); *H01L 21/266* (2013.01); *H01L 29/0623* (2013.01); *H01L 29/0688* (2013.01); *H01L 29/407* (2013.01); *H01L 29/66462* (2013.01); *H01L 29/7786* (2013.01); *H01L 21/26553* (2013.01); *H01L 29/2003* (2013.01); *H01L 29/404* (2013.01); *H01L 29/41766* (2013.01); *H01L 29/42316* (2013.01)

(58) Field of Classification Search
CPC combination set(s) only.
See application file for complete search history.

(56) References Cited

U.S. PATENT DOCUMENTS

| | | | |
|---|---|---|---|
| 8,044,432 B2 | 10/2011 | Chen et al. | |
| 8,530,978 B1 | 9/2013 | Chu et al. | |
| 8,664,695 B2 | 3/2014 | Wu et al. | |
| 9,123,791 B2* | 9/2015 | Curatola | H01L 29/7786 |
| 9,728,630 B2* | 8/2017 | Prechtl | H01L 29/7787 |
| 2013/0153967 A1* | 6/2013 | Curatola | H01L 29/407 257/194 |
| 2016/0141405 A1* | 5/2016 | Werner | H01L 29/7786 257/76 |

FOREIGN PATENT DOCUMENTS

| | | |
|---|---|---|
| CN | 103178108 | 6/2013 |
| CN | 105405877 | 3/2016 |
| TW | 201119033 | 6/2011 |

\* cited by examiner

*Primary Examiner* — Mamadou L Diallo
(74) *Attorney, Agent, or Firm* — JCIPRNET

(57) ABSTRACT

A semiconductor substrate and a semiconductor device are disclosed. The semiconductor substrate includes a base layer, a buffer layer disposed on the base layer, a channel layer disposed on the buffer layer, a barrier layer disposed on the channel layer, and a buried field plate region embedded in the channel layer. In an embodiment, the channel layer includes a two-dimensional electron gas (2DEG), and the buried field plate region is located below the two-dimensional electron gas.

18 Claims, 12 Drawing Sheets

SEMICONDUCTOR SUBSTRATE AND SEMICONDUCTOR DEVICE

CROSS-REFERENCE TO RELATED APPLICATION

This application claims the priority benefit of Taiwan application serial no. 105142128, filed on Dec. 20, 2016. The entirety of the above-mentioned patent application is hereby incorporated by reference herein and made a part of this specification.

BACKGROUND OF THE INVENTION

Field of Invention

The present invention relates to a semiconductor substrate and a semiconductor device.

Description of Related Art

A field effect transistor is easy to suffer current collapse during a high frequency or high power operation, and thus, current in a saturation region is significantly decreased and turn on delay is greatly increased. This phenomenon occurs because a large number of electrons are captured in trap states of the semiconductor surface when the device is operated in a high electric field. It takes time for the captured electrons to escape from the trap states. Therefore, when the device is operated at a high frequency, the trapped electrons may be unable to escape from where they are trapped, and thus, the channel may be depleted and the current collapse may occur.

In order to resolve the above issues, a conventional metal field plate is disposed above a field effect transistor, so as to reduce the electric field between the gate electrode and the drain electrode. Such metal field plate is beneficial to effectively disperse the high electric field. However, the parasitic capacitance of the device is greatly increased accordingly.

SUMMARY OF THE INVENTION

Accordingly, the present invention provides a semiconductor substrate and a semiconductor device, so as to effectively disperse the high electric field and prevent an increase in parasitic capacitance caused by the conventional metal field plate.

The present invention provides a semiconductor substrate that includes a base layer, a buffer layer disposed on the base layer, a channel layer disposed on the buffer layer, a barrier layer disposed on the channel layer, and a buried field plate region embedded in the channel layer. In an embodiment, the channel layer includes a two-dimensional electron gas (2DEG), and the buried field plate region is located below the two-dimensional electron gas.

According to an embodiment of the present invention, the buried field plate region includes a negatively charged region.

According to an embodiment of the present invention, the buried field plate region further includes a positively charged region aside the negatively charged region.

According to an embodiment of the present invention, the buried field plate region includes a plurality of separate regions.

According to an embodiment of the present invention, the buried field plate region has different depths.

According to an embodiment of the present invention, the buried field plate region has the same depth.

The present invention provides a semiconductor device that includes a base layer, a buffer layer disposed on the base layer, a channel layer disposed on the buffer layer, a buried field plate region embedded in the channel layer and located below a two-dimensional electron gas (2DEG), a barrier layer disposed on the channel layer, and a device layer disposed on the barrier layer, wherein the device layer includes a first electrode and a second electrode, and a projecting area of the buried field plate region projected on the base layer does not overlap with a projecting area of the second electrode projected on the base layer.

According to an embodiment of the present invention, the semiconductor device further includes a third electrode disposed between the first electrode and the second electrode, wherein the first electrode is a source electrode, the second electrode is a drain electrode, and the third electrode is a gate electrode.

According to an embodiment of the present invention, the semiconductor device further includes a P-type semiconductor layer located between the gate electrode and the barrier layer.

According to an embodiment of the present invention, the gate electrode extends through the barrier layer and the two-dimensional electron gas.

According to an embodiment of the present invention, the buried field plate region is separated from the drain electrode by a horizontal distance.

According to an embodiment of the present invention, a projecting area of the buried field plate region projected on the base layer does not overlap with a projecting area of the first electrode projected on the base layer.

According to an embodiment of the present invention, a depth of the buried field plate region near the source electrode is less than a depth of the buried field plate region near the drain electrode.

According to an embodiment of the present invention, a depth of the buried field plate region near the source electrode is greater than a depth of the buried field plate region near the drain electrode.

According to an embodiment of the present invention, the buried field plate region includes a first part located below the source electrode, a second part located at least between the gate electrode and the drain electrode, and a third part connecting the first part and the second part.

According to an embodiment of the present invention, the buried field plate region includes a negatively charged region and a positively charged region located aside the negatively charged region, and a projecting area of the gate electrode projected on the base layer does not exceed a projecting area of the positively charged region projected on the base layer.

According to an embodiment of the present invention, the first electrode is a cathode, and the second electrode is an anode.

According to an embodiment of the present invention, an average depth of the buried field plate region near the first electrode is greater than an average depth of the buried field plate region near the second electrode.

According to an embodiment of the present invention, the buried field plate region has a tapered profile.

Based on the above, the aggregation effect of high electric field between electrodes can be effectively dispersed by the disposition of the buried field plate region of the present invention. Moreover, the buried field plate region of the present invention is buried in the channel layer, so an additional field plate above the electrodes is not required, and the complexity of the manufacturing process is accordingly reduced. Besides, the semiconductor device of the present invention does not require a metal field plate, and therefore, the effect of parasitic capacitance on the device can be significantly reduced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
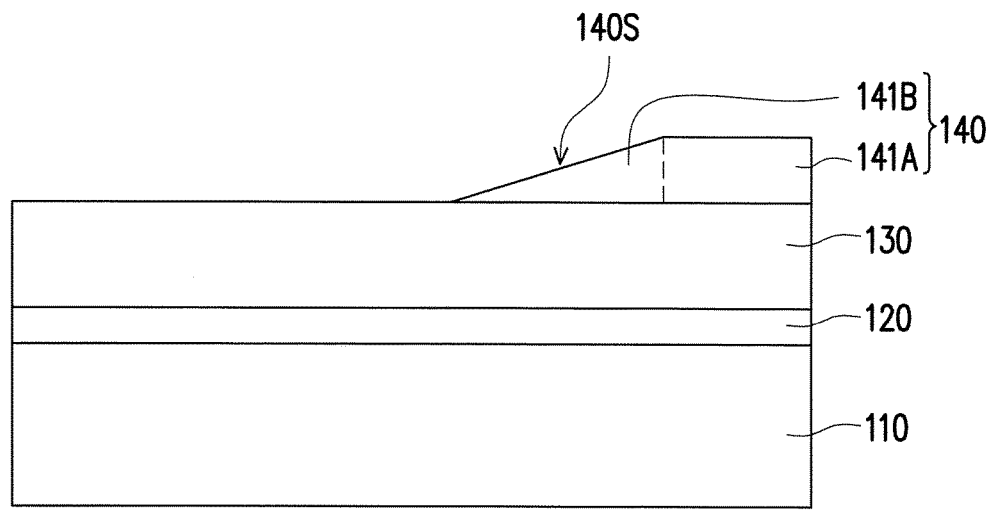
FIG. 1A to FIG. 1D are schematic cross-sectional views of a method of forming a semiconductor device in accordance with an embodiment of the present invention.

Reference will now be made in detail to the present preferred embodiments of the invention, examples of which are illustrated in the accompanying drawings. Wherever possible, the same reference numbers are used in the drawings and the description to refer to the same or like elements.

FIG. 1A to FIG. 1D are schematic cross-sectional views of a method of forming a semiconductor device in accordance with an embodiment of the present invention. FIG. 2 is a simplified top view of FIG. 1D. For clarity of illustration, only the relative position of the electrodes and the buried field plate region are shown in FIG. 2, and other components are omitted.

Figure 2:
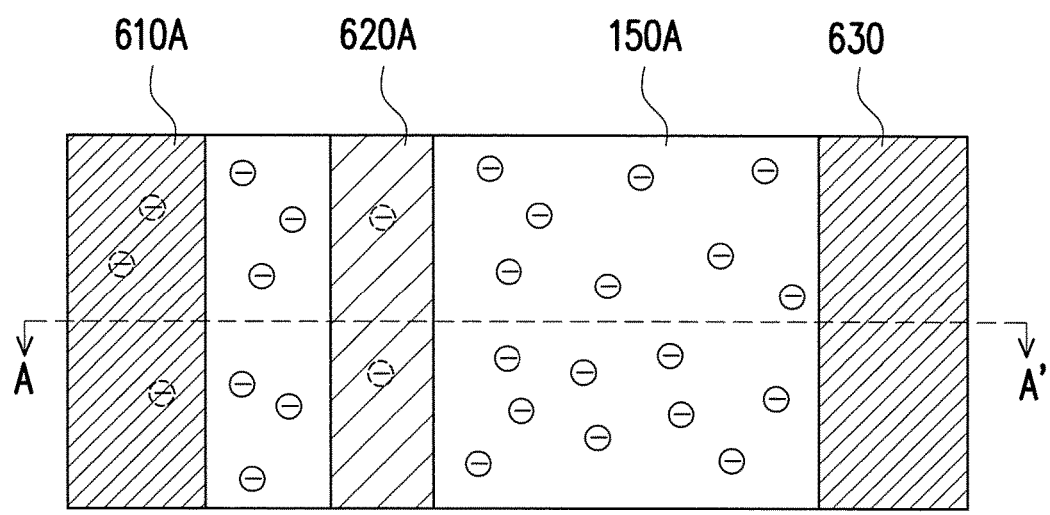
FIG. 2 is a simplified top view of FIG. 1D.

Referring to FIG. 1A, a base layer 110 is provided. In an embodiment, the base layer 110 includes silicon. Thereafter, a buffer layer 120 and a channel layer 130 are sequentially formed on the base layer 110. In an embodiment, the buffer layer 120 includes aluminum nitride (AlN), and the channel layer 130 includes gallium nitride (GaN). The method of forming each of the buffer layer 120 and the channel layer 130 includes performing an epitaxial growth process.

Afterwards, a mask layer 140 is formed on the channel layer 130. In an embodiment, the mask layer 140 has an inclined surface 140S, as shown in FIG. 1A. Specifically, the mask layer 140 can be divided into mask patterns 141A and 141B, the mask pattern 141A has a substantially uniform thickness, and the mask pattern 141B has a thickness gradually reduced away from the mask pattern 141A.

The embodiment of FIG. 1A in which the mask layer 140 has a smooth inclined surface is provided for illustration purposes, and is not construed as limiting the present invention. In another embodiment, the mask layer 140 may have a stepped inclined surface. In yet another embodiment, the mask layer 140 does not have an inclined surface and the thickness thereof is substantially uniform.

Moreover, the mask layer 140 in FIG. 1A is formed to merely cover a right side portion of the channel layer 130. However, the present invention is not limited thereto. In an embodiment, upon the process requirements, the mask layer can further cover a central portion or a left side portion of the channel layer. For example, the mask layer covers side portions and exposes a central portion of the channel layer.

In an embodiment, the mask layer is a photoresist layer, and its desired pattern is formed by a photolithography process. In an embodiment, a photolithography process is performed to a photoresist layer with a photomask having different light transmittance, so as to form a mask layer with an inclined surface, as shown in FIG. 1A. In another embodiment, the mask layer is a hard mask layer or a dielectric layer, and its desired pattern is formed by a deposition process and a subsequent patterning process.

Figure 1B:
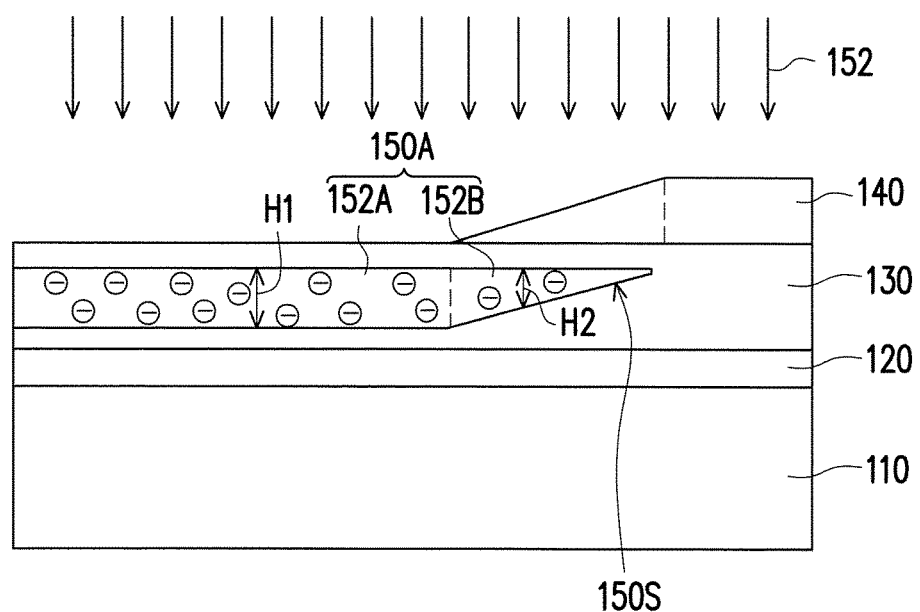

Referring to FIG. 1B, an ion implantation process 152 is performed to the channel layer 130. In an embodiment, the ion implantation energy ranges from about 1 KeV to 500 KeV, and the doping concentration ranges from about 1E13 $cm^{-2}$ to 1E19 $cm^{-2}$.

In an embodiment, the mask layer 140 has an inclined surface 140S, so the buried field plate region 150A formed by the ion implantation process 152 is formed with a corresponding inclined surface 150S. Specifically, the region covered by the mask pattern 141A is not implanted, the region covered by the mask pattern 141B having the inclined surface 140S is partially implanted, and the region uncovered by the mask patterns 141A and 141B is fully implanted. Therefore, as shown in FIG. 1C, the top surface of the buried field plate region 150A is substantially parallel to the top surface of the channel layer 130, and the bottom surface of the buried field plate region 150A has an inclined surface 150S corresponding to the inclined surface 140S of the mask layer 140.

Since the mask layer 140 has different thicknesses, the buried field plate region 150A formed by the ion implantation process 152 through the mask layer 140 is formed with different depths. In an embodiment, the buried field plate region 150A can be divided into a field plate region 152A and a field plate region 152B, the field plate region 152A has a substantially uniform depth H1 measured from the top surface thereof, and the field plate region 152B has a gradually reduced depth H2 measured from the top surface thereof. Specifically, the thickness of the field plate region 152B is gradually reduced away from the field plate region 152A. In other words, the depth H1 of the field plate region 152A is greater than the average depth H2 of the field plate region 152B. Herein, such buried field plate region 150A is also referred to as a buried field plate region with a tapered end because the field plate region 152B thereof has a tapered profile.

In an embodiment, the buried field plate region 150A includes a negatively charged region. In an embodiment, the negatively charged region is formed by implanting fluorine ions, carbon ions, silicon ions or oxygen ions. Thereafter, the mask layer 140 is removed.

Figure 1C:
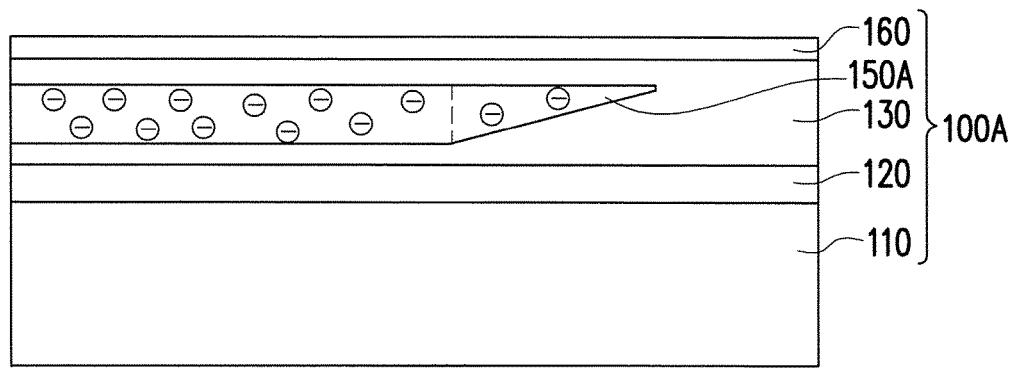

Referring to FIG. 1C, a barrier layer 160 is formed on the channel layer 130. In an embodiment, the barrier layer 160 includes aluminum gallium nitride (AlGaN). The method of forming the barrier layer 160 includes performing an epitaxial growth process. The semiconductor substrate 100A of the present invention is thus completed.

Specifically, the semiconductor substrate 100A of the present invention includes a base layer 110, a buffer layer 120 disposed on the base layer 110, a channel layer 130 disposed on the buffer layer 120, a barrier layer 160 disposed on the channel layer 130, and a buried field plate region 150A embedded in the channel layer 130.

Referring to 1D, after the semiconductor substrate 100A is formed, a device layer 600A is formed on the barrier layer 160. In an embodiment, the channel layer 130 includes a two-dimensional electron gas (2DEG) 132, and the buried field plate region 150A is located below the two-dimensional electron gas 132.

Figure 1D:
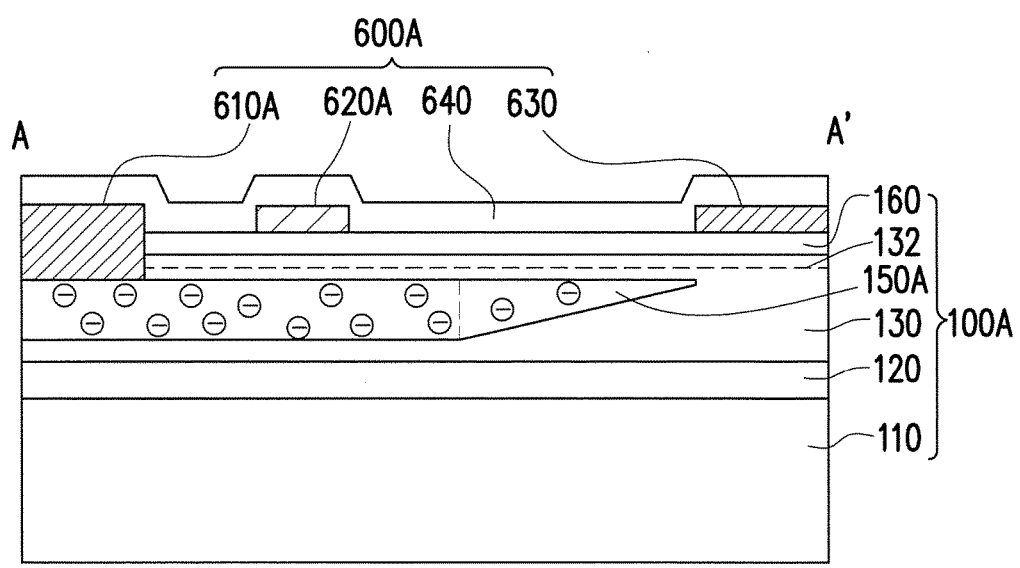

In an embodiment, the device layer 600A includes an electrode 610A, an electrode 630, an electrode 620A and a dielectric layer 640. The electrode 610A extends through the barrier layer 160 and the two-dimensional electron gas 132, and is in contact with the buried field plate region 150A. The electrode 630 and the electrode 620A are located on the barrier layer 160. In an embodiment, the projecting area of the buried field plate region 150A projected (e.g., vertically projected) on the base layer 110 does not overlap with the projecting area of the electrode 630 projected (e.g., vertically projected) on the base layer 110. In other words, the buried field plate region 150A does not extend below the electrode 630. As shown in FIG. 1D, the edge of the buried field plate region 150A is aligned with the edge of the electrode 630. Moreover, the dielectric layer 640 covers the electrode 610A, the electrode 630 and the electrode 620A.

In an embodiment, the electrode 610A serves as a source electrode, the electrode 630 serves as a drain electrode, and the electrode 620A serves as a gate electrode. In an embodiment, the electrodes 610A and 630 include titanium, aluminum or a combination thereof. In an embodiment, the electrode 620A includes nickel, gold, or a combination thereof. In an embodiment, the device layer 600A further includes a gate insulating layer (not shown) between the electrode 620A and the barrier layer 160. The semiconductor device 10 is thus completed.

Specifically, the semiconductor device 10 of the invention includes a base layer 110, a buffer layer 120 disposed on the base layer 110, a channel layer 130 disposed on the buffer layer 120, a buried field plate region 150A embedded in the channel layer 130 and located below a two-dimensional electron gas 132, and a device layer 600A disposed on the barrier layer 160. In an embodiment, the device layer 600A includes an electrode 610A and an electrode 630, and the projecting area of the buried field plate region 150A projected on the base layer 110 does not overlap with the projecting area of the electrode 630 projected on the base layer 110.

It is noted that, instead of the conventional metal field plate, the buried field plate region 150A of the present invention is configured to effectively disperse the electric field and to prevent the parasitic capacitance caused by the conventional metal field plate. In an embodiment, the average depth of the buried field plate region 150A near the electrode 610A (e.g., source electrode) is greater than the average depth of the buried field plate region 150A near the electrode 630 (e.g., drain electrode). Specifically, the depth of the buried field plate region 150A is gradually reduced toward the electrode 630 (e.g., drain electrode), and is in contact with the electrode 610A (e.g., source electrode). In this configuration, the electric field can be effectively dispersed and the device performance can be accordingly improved.

Figure 3A:
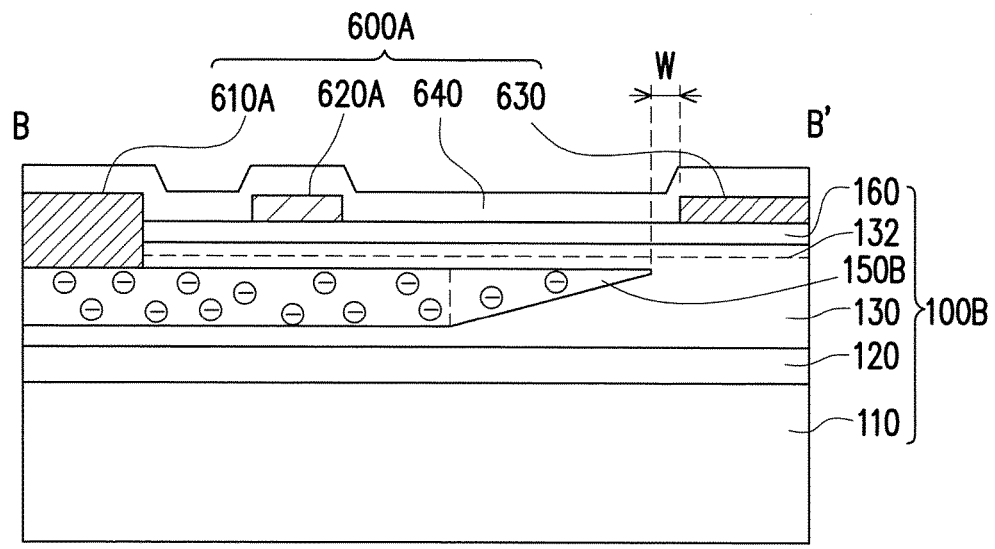
FIG. 3A is a schematic cross-sectional view of a semiconductor device in accordance with another embodiment of the present invention.
Figure 3B:
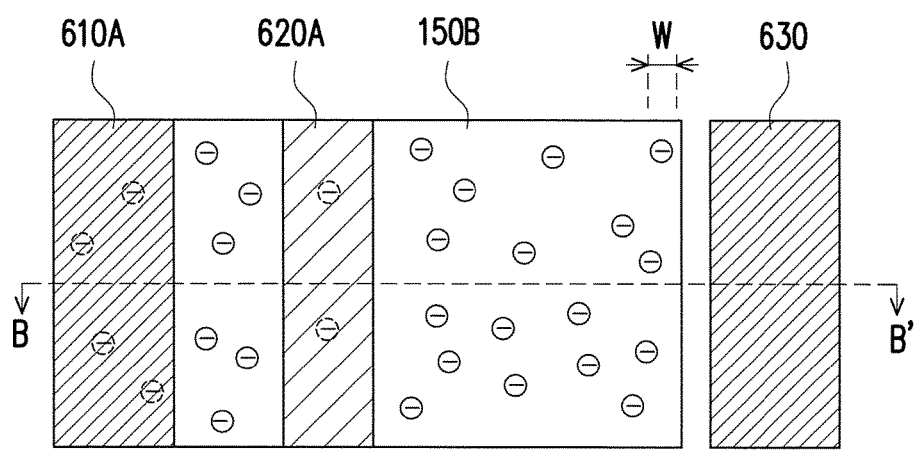
FIG. 3B is a simplified top view of FIG. 3A.

FIG. 3A is a schematic cross-sectional view of a semiconductor device in accordance with another embodiment of the present invention. FIG. 3B is a simplified top view of FIG. 3A.

The semiconductor device 11 is similar to the semiconductor device 10, and the difference between them lies in that, in the semiconductor device 11, the edge of the buried field plate 150B of the semiconductor substrate 100B is separated from the edge of the electrode 630 of the device layer 600A by a horizontal distance W.

Figure 4A:
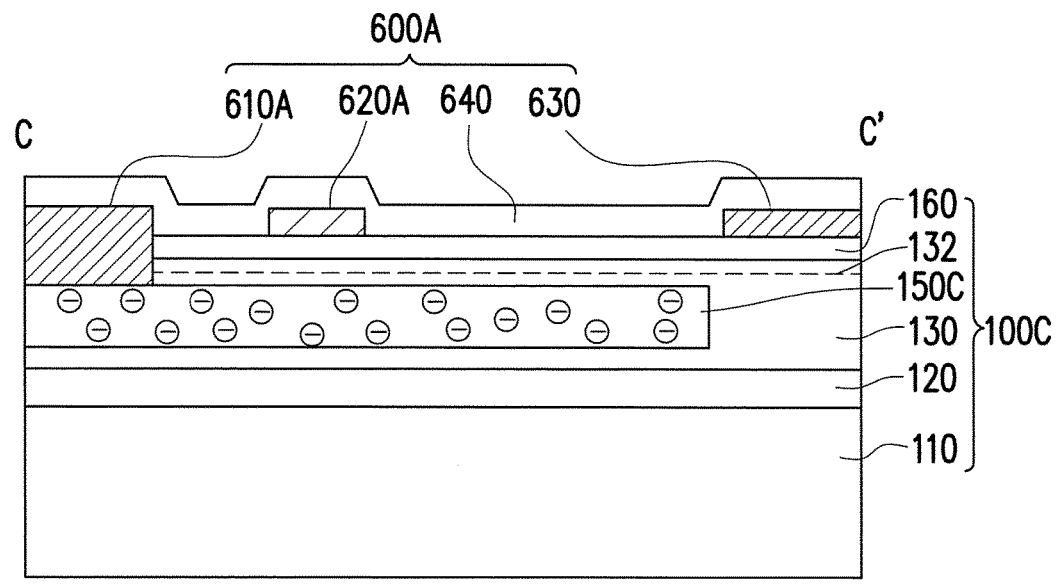
FIG. 4A is a schematic cross-sectional view of a semiconductor device in accordance with yet another embodiment of the present invention.
Figure 4B:
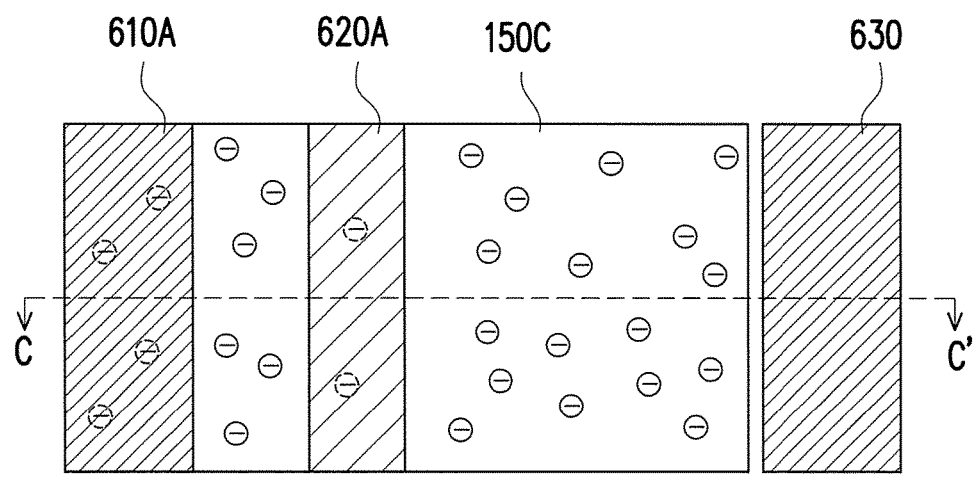
FIG. 4B is a simplified top view of FIG. 4A.

FIG. 4A is a schematic cross-sectional view of a semiconductor device in accordance with yet another embodiment of the present invention. FIG. 4B is a simplified top view of FIG. 4A.

The semiconductor device 20 is similar to the semiconductor device 11, and the difference between them lies in that, in the semiconductor device 20, the buried field plate region 150C of the semiconductor substrate 100C has substantially the same depth. For example, a mask layer with a uniform thickness is used as an implant mask during the step of implanting the buried field plate region 150C, and therefore, the buried field plate region 150C is formed with an equal thickness.

Figure 5A:
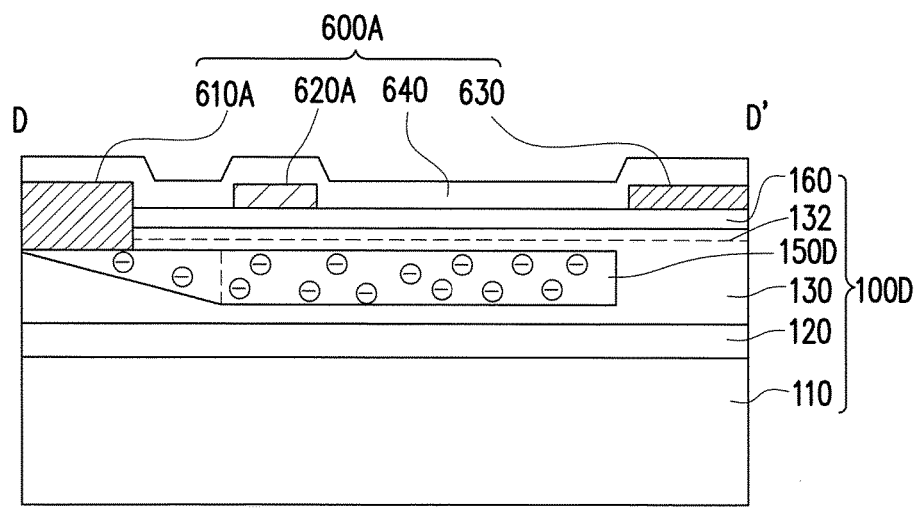
FIG. 5A is a schematic cross-sectional view of a semiconductor device in accordance with still another embodiment of the present invention.
Figure 5B:
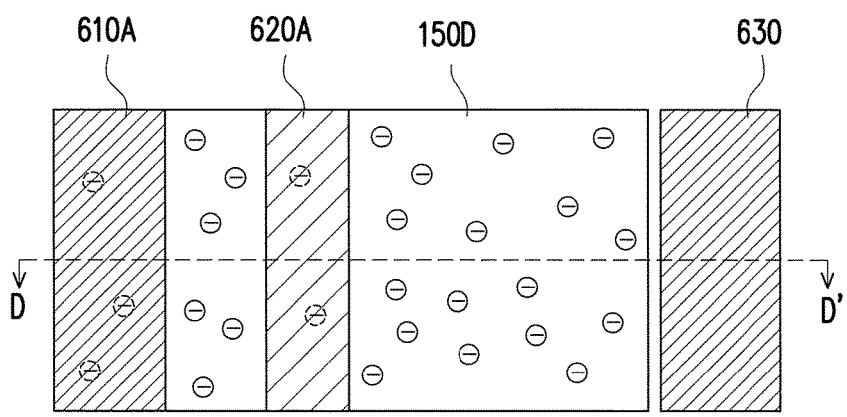
FIG. 5B is a simplified top view of FIG. 5A.

FIG. 5A is a schematic cross-sectional view of a semiconductor device in accordance with still another embodiment of the present invention. FIG. 5B is a simplified top view of FIG. 5A.

The semiconductor device 30 is similar to the semiconductor device 11, and the difference between them lies in that, in the semiconductor device 30, the average depth of the buried field plate region 150D of the semiconductor substrate 100D near the electrode 610A is smaller than the average depth of the buried field plate region 150D near the electrode 630. Specifically, the depth of the buried field plate region 150D is gradually reduced toward the electrode 610A (e.g., source electrode), and is in contact with the electrode 610A.

Figure 6A:
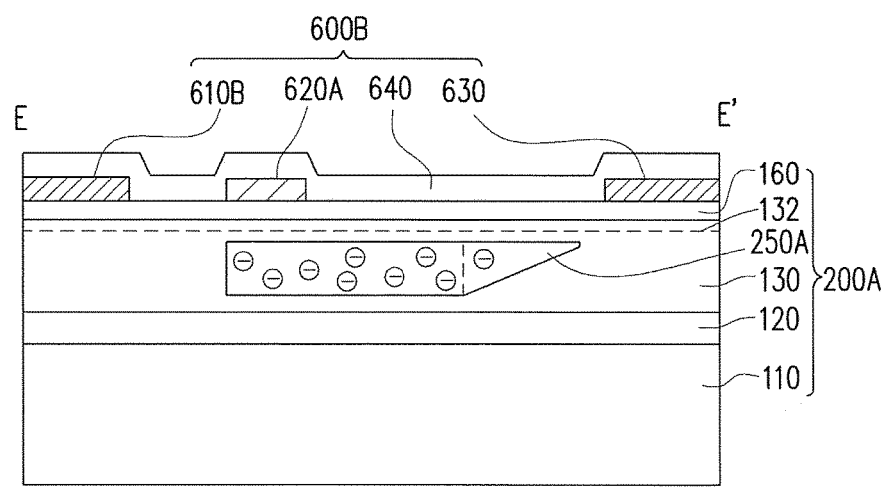
FIG. 6A is a schematic cross-sectional view of a semiconductor device in accordance with an embodiment of the present invention.
Figure 6B:
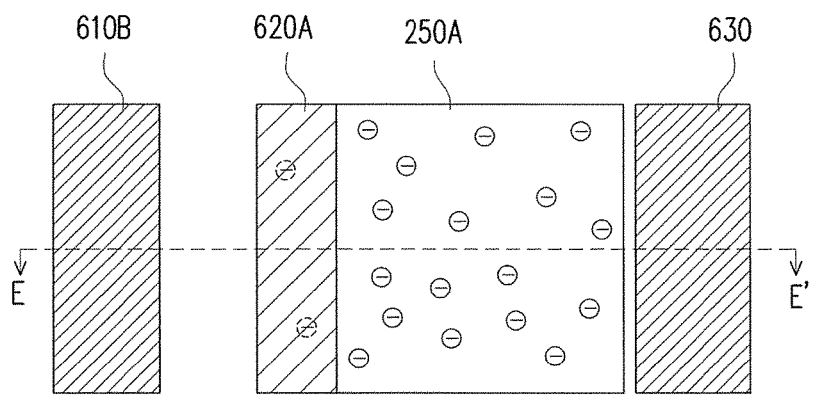
FIG. 6B is a simplified top view of FIG. 6A.

FIG. 6A is a schematic cross-sectional view of a semiconductor device in accordance with an embodiment of the present invention. FIG. 6B is a simplified top view of FIG. 6A.

The semiconductor device 40 is similar to the semiconductor device 11, and the difference between them lies in that, in the semiconductor device 40, the electrode 610B of the device layer 600B does not extend through the barrier layer 160, and the projecting area of the buried field plate region 250A of the semiconductor substrate 200A projected on the base layer 110 does not overlap with the projecting area of the electrode 610B projected on the base layer 110.

In FIG. 6A and FIG. 6B, the edge of the buried field plate 250A is aligned with the edge of the electrode 620A. However, the present invention is not limited thereto. In another embodiment, the edge of the buried field plate region 250A may exceed the edge of the electrode 620A and further extend below the electrode 610B.

Figure 7A:
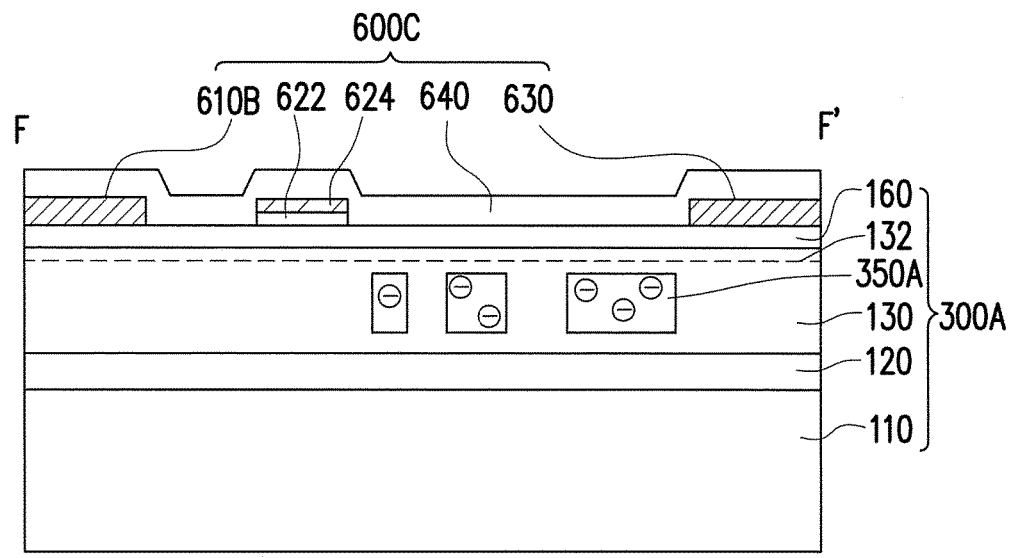
FIG. 7A is a schematic cross-sectional view of a semiconductor device according to another embodiment of the present invention.
Figure 7B:
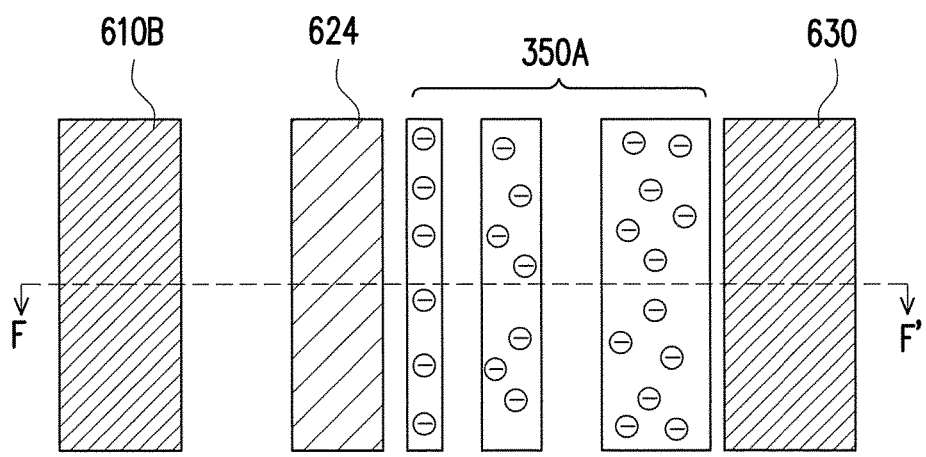
FIG. 7B is a simplified top view of FIG. 7A.

FIG. 7A is a schematic cross-sectional view of a semiconductor device according to another embodiment of the present invention. FIG. 7B is a simplified top view of FIG. 7A.

Figure 8A:
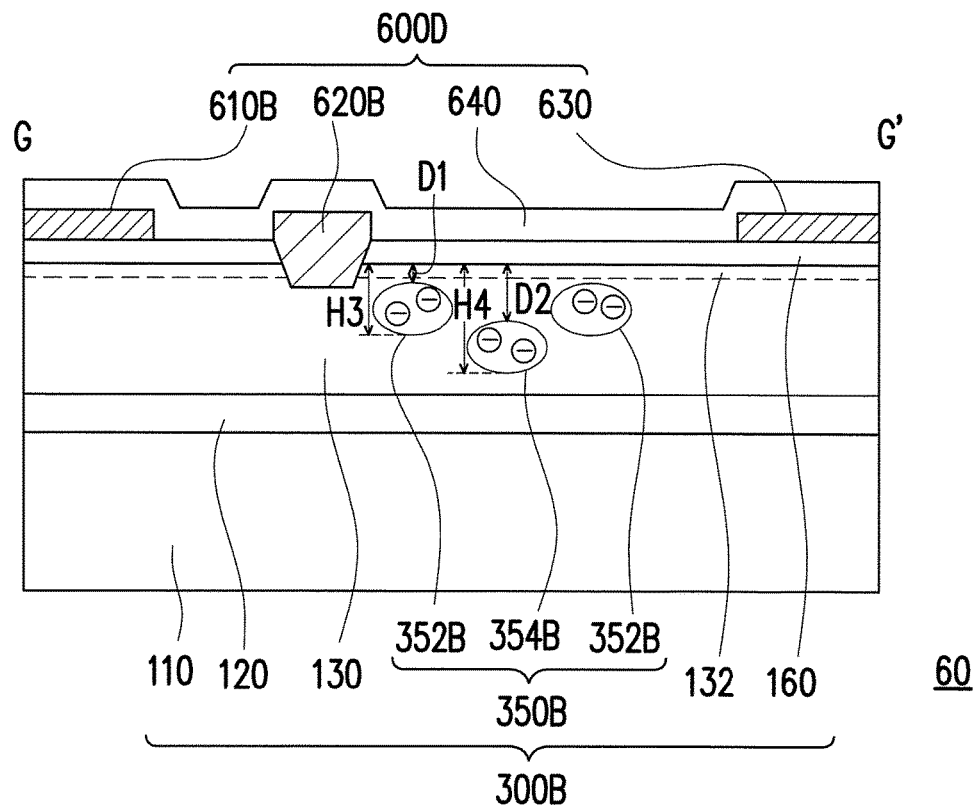
FIG. 8A is a schematic cross-sectional view of a semiconductor device in accordance with yet another embodiment of the present invention.

The semiconductor device 50 is similar to the semiconductor device 40, and the difference between them lies in that, in the semiconductor device 50, the device layer 600C includes a gate electrode 624 and a P-type semiconductor layer 622 located between the gate electrode 624 and the barrier layer 160, and the buried field plate region 350A of the semiconductor substrate 300A includes a plurality of separate field plate regions. In an embodiment, any two adjacent field plate regions are separated from each other by a non-constant distance, as shown in FIG. 7A and FIG. 8A. In another embodiment, any two adjacent field plate regions are separated from each other by a constant distance.

In FIG. 7A, the buried field plate region 350A only has three separate field plate regions that are located merely between the gate electrode 624 and the electrode 630. However, the present invention is not limited thereto. In another embodiment, the buried field plate region 350A may have two, four or more separate field plate regions, and a portion thereof may extend below the gate electrode or even extend below the source electrode. In an embodiment, the P-type semiconductor layer 622 includes P-type gallium nitride.

Figure 8B:
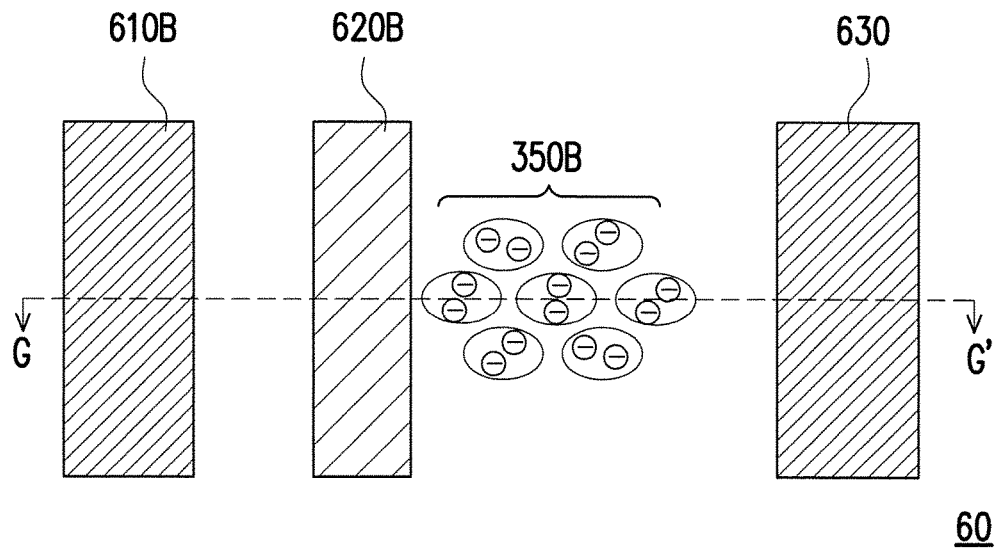
FIG. 8B is a simplified top view of FIG. 8A.

FIG. 8A is a schematic cross-sectional view of a semiconductor device in accordance with yet another embodiment of the present invention. FIG. 8B is a simplified top view of FIG. 8A.

The semiconductor device 60 is similar to the semiconductor device 50, and the difference between them lies in that, in the semiconductor device 60, the electrode 620B of the device layer 600D extends through the barrier layer 160 and the two-dimensional electron gas 132, and the buried field plate region 350B of the semiconductor substrate 300B has a plurality of separate field plate regions with different depths.

In the buried field plate region 350B, the depth H3 of each shallow field plate region 352B measured from the surface of the channel layer 130 is less than the depth H4 of each deep field plate region 354B measured from the surface of the channel layer 130, and the distance D1 from the top of each shallow field plate region 352B to the barrier layer 160 is less than the distance D2 from the top of each deep field plate region 354B to the barrier layer 160. Specifically, as shown in FIG. 8A, the shallow and deep field plate regions 352B and 354B are arranged alternately or in a staggered relation with each other in the channel layer 130.

In FIG. 8A and FIG. 8B, the buried field plate region 350B is located in the channel layer 130 merely between the electrode 620B and the electrode 630. However, the present invention is not limited thereto. In another embodiment, a portion of the field plate regions of the buried field plate region 350B can be disposed below the electrode 620B, or even extend below the electrode 610B.

Figure 9A:
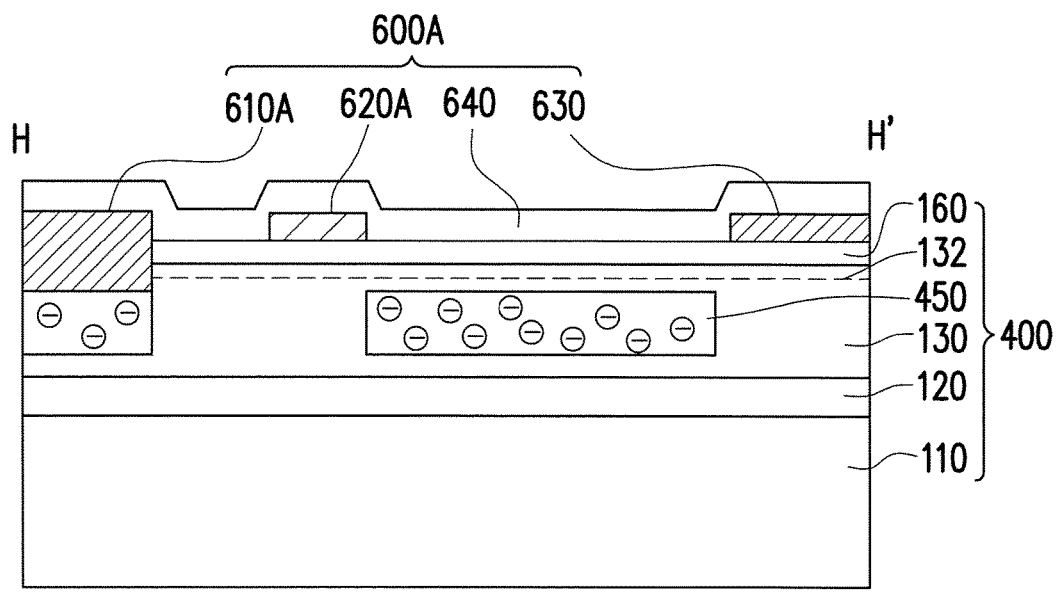
FIG. 9A is a schematic cross-sectional view of a semiconductor device in accordance with still another embodiment of the present invention.
Figure 9B:
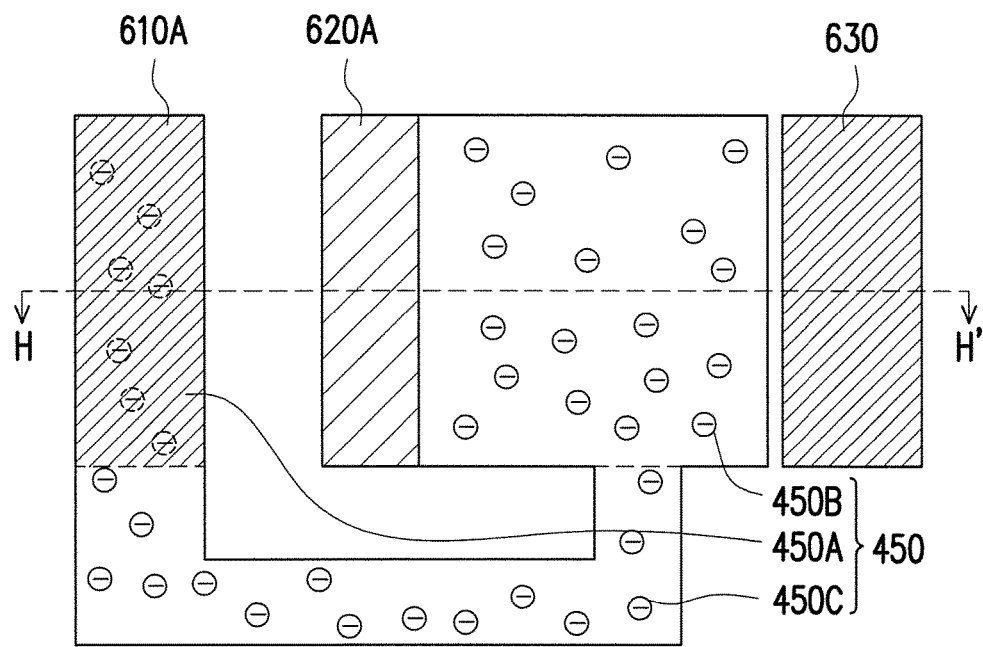
FIG. 9B is a simplified top view of FIG. 9A.

FIG. 9A is a schematic cross-sectional view of a semiconductor device in accordance with still another embodiment of the present invention. FIG. 9B is a simplified top view of FIG. 9A.

The semiconductor device 70 is similar to the semiconductor device 20, and the difference between them lies in that, in the semiconductor device 70, the buried field plate region 450 of the semiconductor substrate 400 includes a first part 450A located below the electrode 610A, a second part 450B located at least between the electrode 620A and the electrode 630, and a third part 450C connecting the first part 450A and the second part 450B. In an embodiment, the first part 450A and the second part 450B are separated by a distance, and the first part 450A and second part 450B are connected to each other by a U-shaped third part 450C.

In FIG. 9A and FIG. 9B, the second part 450B is located in the channel layer 130 merely between the electrode 620A and the electrode 630. However, the present invention is not limited thereto. In another embodiment, the second part 450B can extend below the electrode 620A and/or the electrode 610A.

Figure 10A:
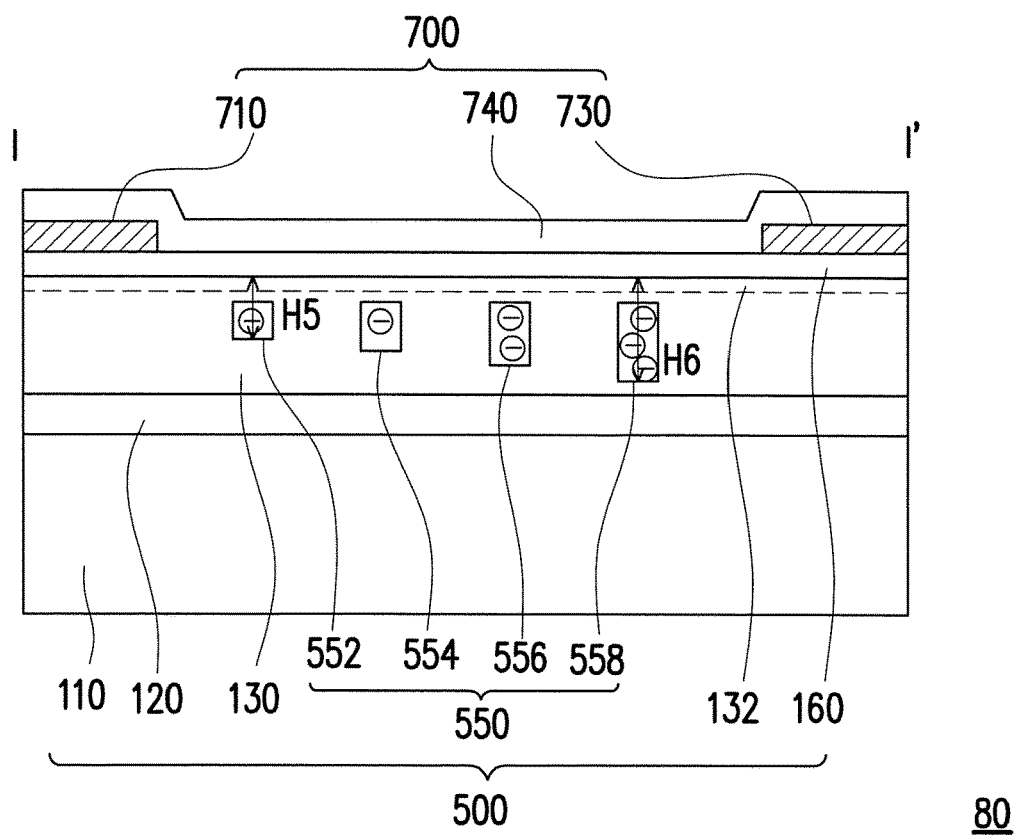
FIG. 10A is a schematic cross-sectional view of a semiconductor device in accordance with an embodiment of the present invention.
Figure 10B:
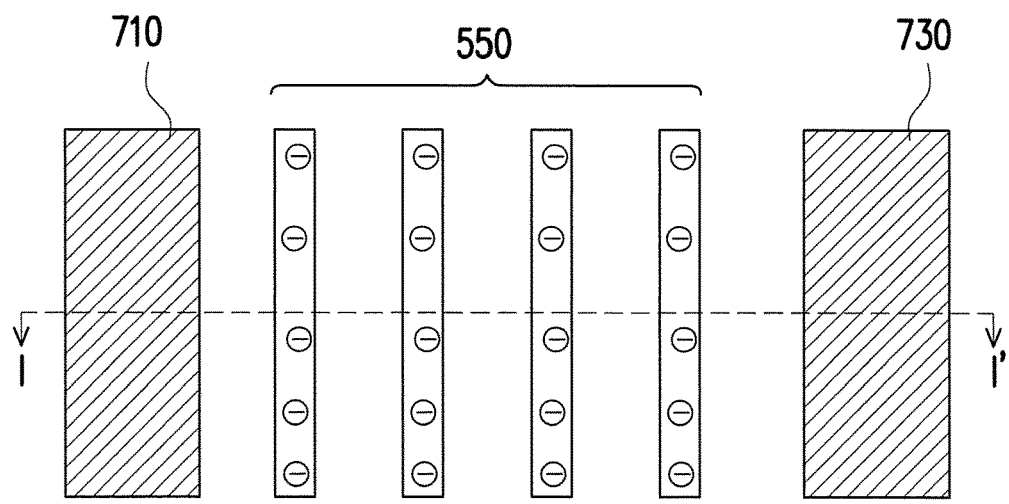
FIG. 10B is a simplified top view of FIG. 10A.

FIG. 10A is a schematic cross-sectional view of a semiconductor device in accordance with an embodiment of the present invention. FIG. 10B is a simplified top view of FIG. 10A.

The semiconductor device 80 is similar to the semiconductor device 40, and the difference between them lies in that, in the semiconductor device 80, the buried field plate region 550 of the semiconductor substrate 500 includes a plurality of separate field plate regions 552, 554, 556 and 558, and the device layer 700 includes an electrode 710, an electrode 730 and a dielectric layer 740. In an embodiment, the electrode 710 is a cathode, and the electrode 730 is an anode.

In an embodiment, as shown in FIG. 10B, the buried field plate region 550 have different depths, wherein the depth H5 of the field plate region 552 the closest to the electrode 710 is less than the depth H6 of the field plate region 558 the closest to the electrode 730. In an embodiment, the depths of field plate regions 552, 554, 556 and 558 are gradually increased toward the electrode 730 (e.g., anode).

Figure 11:
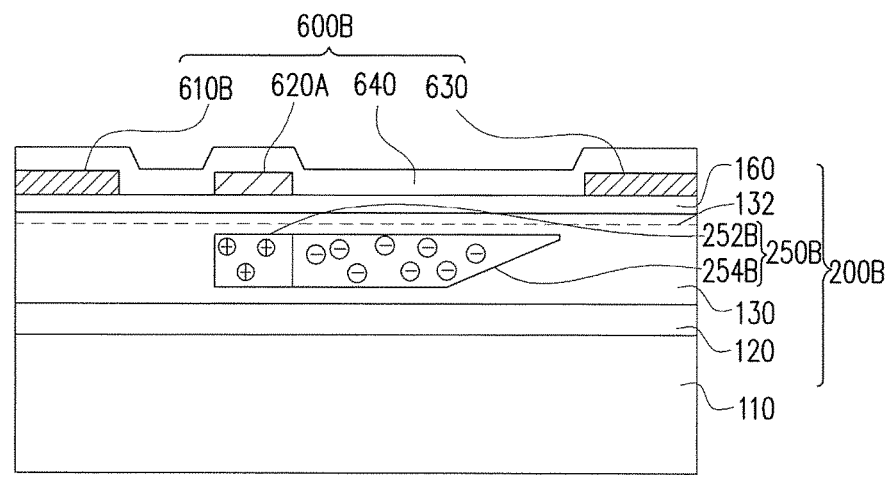
FIG. 11 is a schematic cross-sectional view of a semiconductor device in accordance with another embodiment of the present invention.

FIG. 11 is a schematic cross-sectional view of a semiconductor device in accordance with another embodiment of the present invention.

The semiconductor device 90 is similar to the semiconductor device 40, and the difference between them lies in that, in the semiconductor device 90, the buried field plate region 250B of the semiconductor substrate 200B includes a negatively charged region 254B and a positively charged region 252B located aside negatively charged region 254B, and the projecting area of the positively charged region 252B projected on the base layer 110 does not exceed the projecting area of the electrode 620A projected on the base layer 110.

For example, in FIG. 11, the edge of the positively charged region 252B is aligned with the edge of the electrode 620A. However, the present invention is not limited thereto. In an embodiment, the edge of the electrode 620A may exceed the edge of the positively charged region 252B. Specifically, the electrode 620A can completely cover the positively charged region 252B. In an embodiment, the positively charged region 252B includes magnesium ion, calcium ions or zinc ions.

Figure 12:
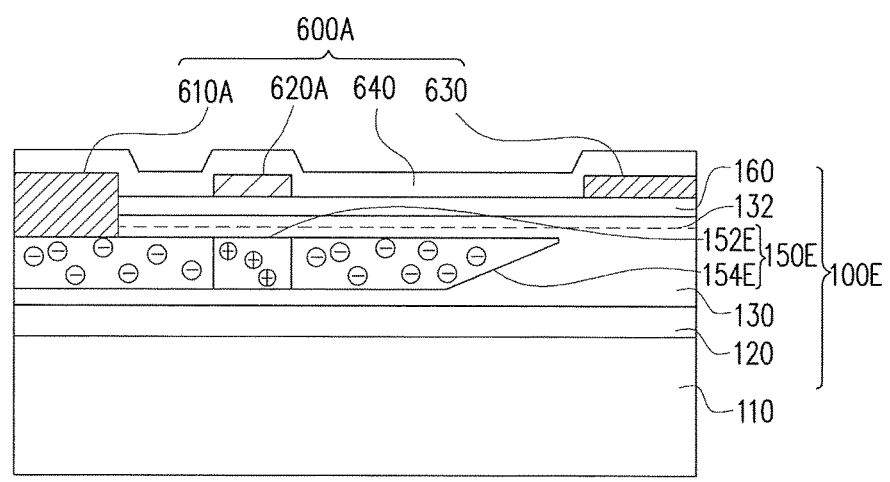
FIG. 12 is a sectional view of a semiconductor device in accordance with yet another embodiment of the present invention.

FIG. 12 is a sectional view of a semiconductor device in accordance with yet another embodiment of the present invention.

The semiconductor device 91 is similar to the semiconductor device 11, and the difference between them lies in that, in the semiconductor device 91, the buried field plate region 150E of the semiconductor substrate 100E includes a positively charged region 152E and two negatively charged regions 154E located beside the positively charged region 152E, and the projecting area of positively charged region 152E projected on the base layer 110 does not exceed the projecting area of the electrode 620A projected on the base layer 110.

For example, as shown in FIG. 12, the edge of the positively charged region 152E is aligned with the edge of the electrode 620A. However, the present invention is not limited thereto. In an embodiment, the edge of the electrode 620A may exceed the edge of the positively charged region 152E. Specifically, the electrode 620A can completely cover the positively charged region 152E. In an embodiment, the positively charged region 152E includes magnesium ion, calcium ions or zinc ions.

In summary, in the present invention, charged carriers are implanted into appropriate region(s) to form a buried field plate region. Such buried field plate region is configured to not only adjust the carrier concentration of the channel layer but also uniformly disperse the aggregation effect of high electric field between the gate electrode and the drain electrode. Moreover, in the present invention, after a buried field plate region is formed in a channel layer, a barrier layer is then formed on the channel layer. Therefore, the interface between the barrier layer and the channel layer is free of damaged during step of forming the buried field plate region. Besides, the conventional metal plate is not required in the present invention, so the parasitic capacitance effect caused by the conventional metal plate can be significantly reduced. In addition, the application of the invention is not limited to the above devices. For example, the concept of the invention can be applied to lateral devices such as D-mode FET, JFET and SBD devices. With the method of the invention, the complexity of the manufacturing process is reduced, the production cost is decreased, and the competitive advantage is achieved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A semiconductor substrate, comprising:
    a base layer;
    a buffer layer, disposed on the base layer;
    a channel layer, disposed on the buffer layer, wherein the channel layer comprises a two-dimensional electron gas (2DEG);
    a barrier layer, disposed on the channel layer; and
    a buried field plate region, embedded in the channel layer, wherein the buried field plate region is located below the two-dimensional electron gas and comprises a negatively charged region and a positively charged region aside the negatively charged region.

2. The semiconductor substrate of claim 1, wherein the buried field plate region comprises a plurality of separate regions.

3. The semiconductor substrate of claim 1, wherein the buried field plate region has different depths.

4. The semiconductor substrate of claim 3, wherein the buried field plate region has a tapered profile.

5. The semiconductor substrate of claim 1, wherein the buried field plate region has the same depth.

6. A semiconductor device, comprising:
    a base layer;
    a buffer layer, disposed on the base layer;
    a channel layer, disposed on the buffer layer;
    a buried field plate region, embedded in the channel layer and located below a two-dimensional electron gas (2DEG);
    a barrier layer, disposed on the channel layer; and
    a device layer, disposed on the barrier layer, wherein the device layer comprises a first electrode and a second electrode, and a projecting area of the buried field plate region projected on the base layer does not overlap with a projecting area of the second electrode projected on the base layer,
    wherein an average depth of the buried field plate region near the first electrode is greater than an average depth of the buried field plate region near the second electrode.

7. The semiconductor device of claim 6, further comprising a third electrode disposed between the first electrode and the second electrode, wherein the first electrode is a source electrode, the second electrode is a drain electrode, and the third electrode is a gate electrode.

8. The semiconductor device of claim 7, further comprising a P-type semiconductor layer located between the gate electrode and the barrier layer.

9. The semiconductor device of claim 7, wherein the gate electrode extends through the barrier layer and the two-dimensional electron gas.

10. The semiconductor device of claim 7, wherein the buried field plate region is separated from the drain electrode by a horizontal distance.

11. The semiconductor device of claim 7, wherein a projecting area of the buried field plate region projected on the base layer does not overlap with a projecting area of the first electrode projected on the base layer.

12. The semiconductor device of claim 7, wherein a depth of the buried field plate region near the source electrode is less than a depth of the buried field plate region near the drain electrode.

13. The semiconductor device of claim 7, wherein a depth of the buried field plate region near the source electrode is greater than a depth of the buried field plate region near the drain electrode.

14. The semiconductor device of claim 7, wherein the buried field plate region comprises:
    a first part, located below the source electrode;
    a second part, located at least between the gate electrode and the drain electrode; and
    a third part, connecting the first part and the second part.

15. The semiconductor device of claim 7, wherein the buried field plate region comprises a negatively charged region and a positively charged region located aside the negatively charged region, and a projecting area of the gate electrode on the base layer does not exceed a projecting area of the positively charged region on the base layer.

16. The semiconductor device of claim 7, wherein the first electrode is a cathode, and the second electrode is an anode.

17. The semiconductor substrate of claim 6, wherein the buried field plate region has a tapered profile.

18. A semiconductor substrate, comprising: a base layer;
a buffer layer, disposed on the base layer; a channel layer, disposed on the butter layer, wherein the channel layer comprises a two-dimensional electron gas (2DEG);
a barrier layer, disposed on the channel layer; and
a buried field plate region, embedded in the channel layer, wherein the buried field plate region is located below the two-dimensional electron gas and comprises a plurality of separate regions, wherein the plurality of separate regions has different depths.

* * * * *